(12) United States Patent
Hsieh et al.

(10) Patent No.: US 7,606,031 B2
(45) Date of Patent: Oct. 20, 2009

(54) HEAT DISSIPATING DEVICE

(75) Inventors: Yi-Shih Hsieh, Taipei Hsien (TW); Peng Qiao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/964,914

(22) Filed: Dec. 27, 2007

(65) Prior Publication Data

US 2009/0168365 A1      Jul. 2, 2009

(51) Int. Cl.
 *H05K 7/20*   (2006.01)
 *F28D 15/00*  (2006.01)
 *F28F 7/00*   (2006.01)
 *H01L 23/34*  (2006.01)

(52) U.S. Cl. ............ 361/700; 165/104.33; 165/185; 257/719; 361/719

(58) Field of Classification Search ............ 257/719; 361/719
See application file for complete search history.

(56) References Cited

U.S. PATENT DOCUMENTS

| | | | |
|---|---|---|---|
| 6,317,328 B1 * | 11/2001 | Su | 361/704 |
| 6,775,030 B2 * | 8/2004 | Krabbenhoft et al. | 358/1.9 |
| 6,786,691 B2 * | 9/2004 | Alden, III | 411/371.2 |
| 6,859,367 B2 * | 2/2005 | Davison | 361/704 |
| 6,859,368 B2 * | 2/2005 | Yang | 361/704 |
| 7,142,422 B2 | 11/2006 | Lee et al. | |
| 7,283,368 B2 * | 10/2007 | Wung et al. | 361/719 |
| 7,333,340 B2 * | 2/2008 | Zhang et al. | 361/719 |
| 7,430,122 B2 * | 9/2008 | Li | 361/719 |
| 7,462,934 B2 * | 12/2008 | Reents | 257/719 |
| 2005/0072558 A1 * | 4/2005 | Whitney et al. | 165/80.3 |
| 2005/0225944 A1 * | 10/2005 | Leu | 361/704 |
| 2006/0232944 A1 | 10/2006 | Zhang et al. | |
| 2007/0217159 A1 * | 9/2007 | Long et al. | 361/704 |

* cited by examiner

*Primary Examiner*—Gregory D Thompson
(74) *Attorney, Agent, or Firm*—Frank R. Niranjan

(57) ABSTRACT

A heat dissipating device includes a circuit board (23), an electronic component (24) being arranged on the circuit board, a base (211) being thermally attached to the electronic component, and a plurality of fasteners (22). The circuit board defines a plurality of screw holes (230) therein. The base defines a plurality of through holes (213) corresponding to the screw holes of the circuit board. Each fastener includes a bolt (27) extending through a corresponding through hole of the base and then threadly engaging into a corresponding screw hole of the circuit board, and a coil spring (28) mounted around the bolt. The base forms a plurality of latch hooks (214) near each through hole. A bottom ring (222) of the coil spring is sandwiched between the latch hooks and the base.

12 Claims, 7 Drawing Sheets

HEAT DISSIPATING DEVICE

BACKGROUND OF THE INVENTION

1. Field of the Invention

The present invention relates to a heat dissipating device, and more particularly relates to a securing structure of the heat dissipating device.

2. Description of Related Art

With the continuing development of the electronic technology, electronic packages such as CPUs (central processing units) are generating more and more heat which requires immediate dissipation. A thermal module is usually mounted on the electronic component for dissipating heat generated thereby, and a plurality of mounting elements are needed for securing the thermal module onto the electronic component.

As shown in FIG. 6, each mounting element 12 includes a bolt 121 defining an annular groove 124 near a bottom thereof, a spring 120 disposed around a top of the bolt 121, and a ring-like clipping member 122 capable of being snapped in the groove 124. The clipping members 122 are made of metal with good resiliency. Each of the clipping members 122 radially defines a through slit 125. In assembly of the thermal module 11, the bolts 121 extend through the through holes 110 of the thermal module 11 and the clipping members 122 are expanded radially outwardly the bolts 121; then the expanding force exerted on the clipping members 122 is released so that the clipping members 122 snap in the grooves 124 of the bolts 121, thereby pre-assembling the bolts 121 to the thermal module 11. The bolts 121 then are screwed into screws holes 130 defined in a circuit board 13 on which the electronic package 14 is mounted to assemble the thermal module 11 with the circuit board 13.

During the pre-assembling of the bolts 121 and the clipping members 122 to the thermal module 11, since there is no mechanism formed in the bolts 121 which can reliably ensure the snapping of the clipping members 122 into the grooves 124 of the bolts 121, the clipping members 122 may be mounted to the screwed end portions of the bolts 121 if the clipping members 122 are not aligned with the grooves 124. When this happens, the clipping members 122 could drop from the bolts 121 during transportation of the pre-assembled thermal module 11.

For the foregoing reasons, therefore, there is a need in the art for a securing structure of the heat dissipating device which overcomes the above-mentioned problems.

SUMMARY OF THE INVENTION

According to a preferred embodiment of the present invention, a heat dissipating device includes a circuit board, an electronic component being arranged on the circuit board, a base being thermally attached to the electronic component, and a plurality of fasteners. The circuit board defines a plurality of screw holes therein. The base defines a plurality of through holes corresponding to the screw holes of the circuit board. Each fastener includes a bolt extending through a corresponding through hole of the base and then threadly engaging into a corresponding screw hole of the circuit board, and a coil spring mounted around the bolt. The base forms a plurality of latch hooks near each through hole. A bottom ring of the coil spring is sandwiched between the latch hooks and the base.

Other advantages and novel features of the present invention will be drawn from the following detailed description of the preferred embodiments of the present invention with attached drawings, in which:

BRIEF DESCRIPTION OF THE DRAWINGS

Many aspects of the present heat dissipating device can be better understood with reference to the following drawings. The components in the drawings are not necessarily drawn to scale, the emphasis instead being placed upon clearly illustrating the principles of the present heat dissipating device. Moreover, in the drawings, like reference numerals designate corresponding parts throughout the several views.

DETAILED DESCRIPTION OF THE INVENTION

Figure 1:
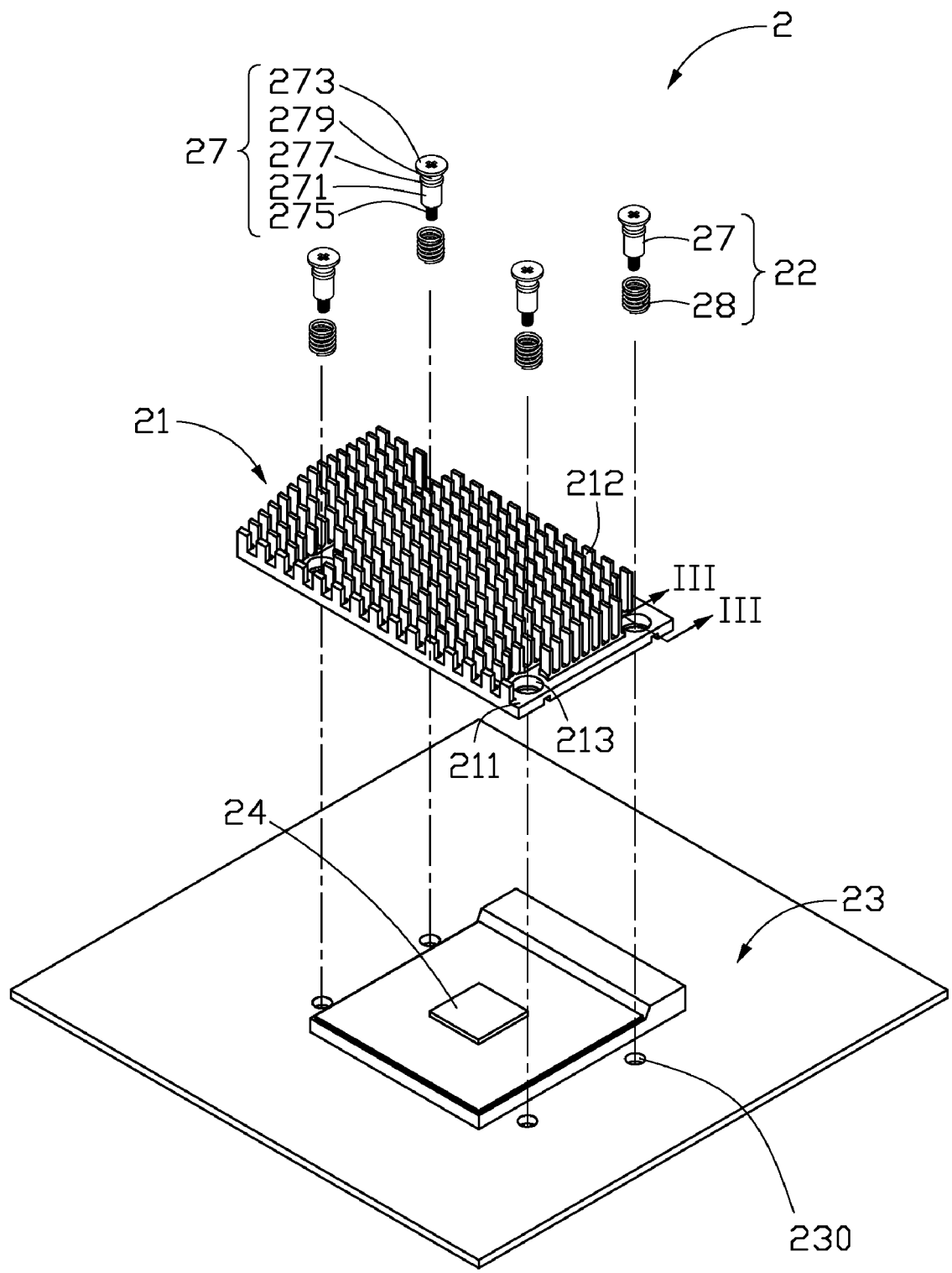
FIG. 1 is an isometric, exploded view of a heat dissipating device in accordance with a preferred embodiment of the present invention.

Referring to FIG. 1, a heat dissipating device 2 according to a preferred embodiment includes an electronic component 24, a heat sink 21 and a plurality of fasteners 22 for securing the heat sink 21 to the electronic component 24.

The electronic component 24 is mounted on a circuit board 23. The circuit board 23 defines four screw holes 230 around the electronic component 24. Each screw hole 230 forms an inner thread. The heat sink 21 includes a base 211 being thermally attached to the electronic component 24 and a plurality of fins 212 extending upwardly from the base 211. The base 211 defines four through holes 213 in four corners thereof. Each through hole 213 corresponds to one of the four screw holes 230 of the circuit board 23.

Figure 2:
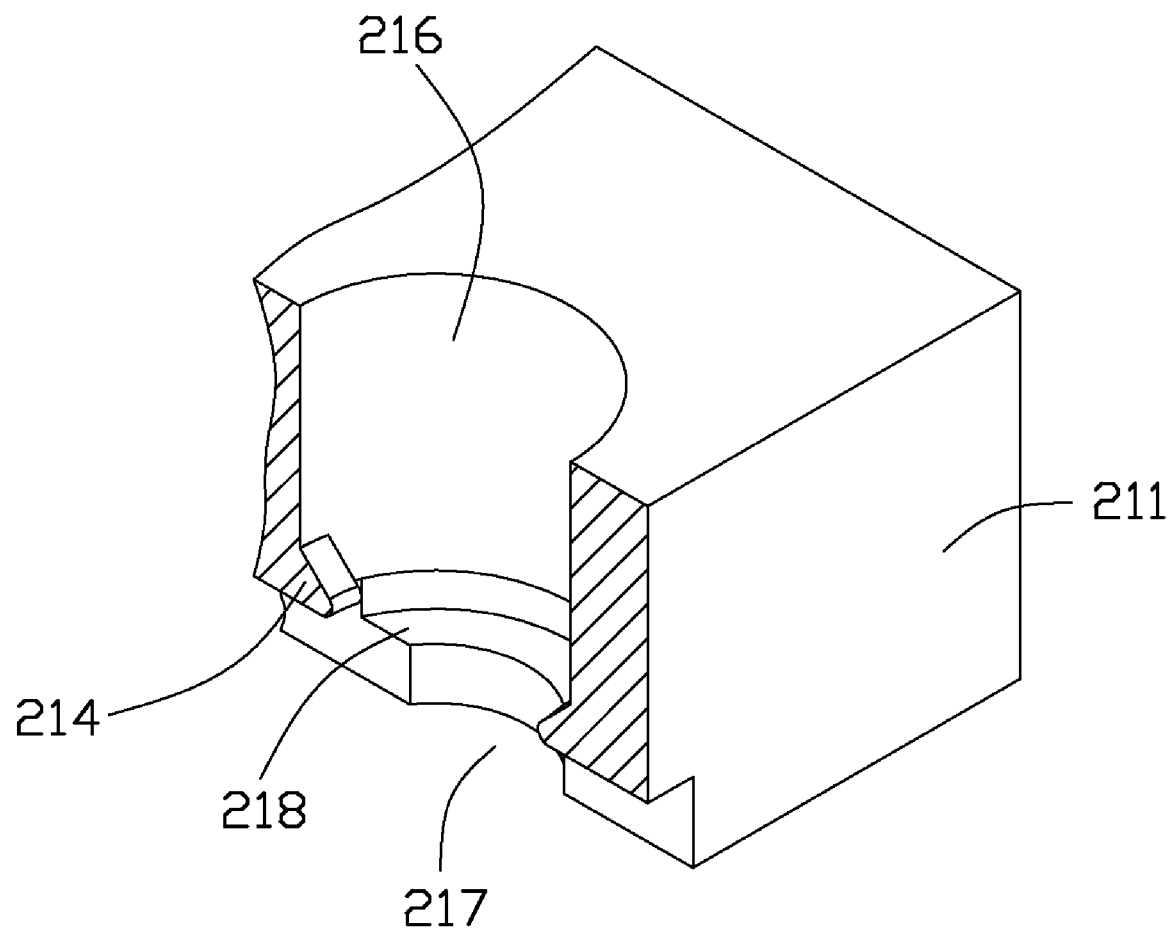
FIG. 2 is an isometric, cross-sectional view of a heat sink of FIG. 1 taken along line II-II to clearly show a latch hook of the heat sink.
Figure 3:
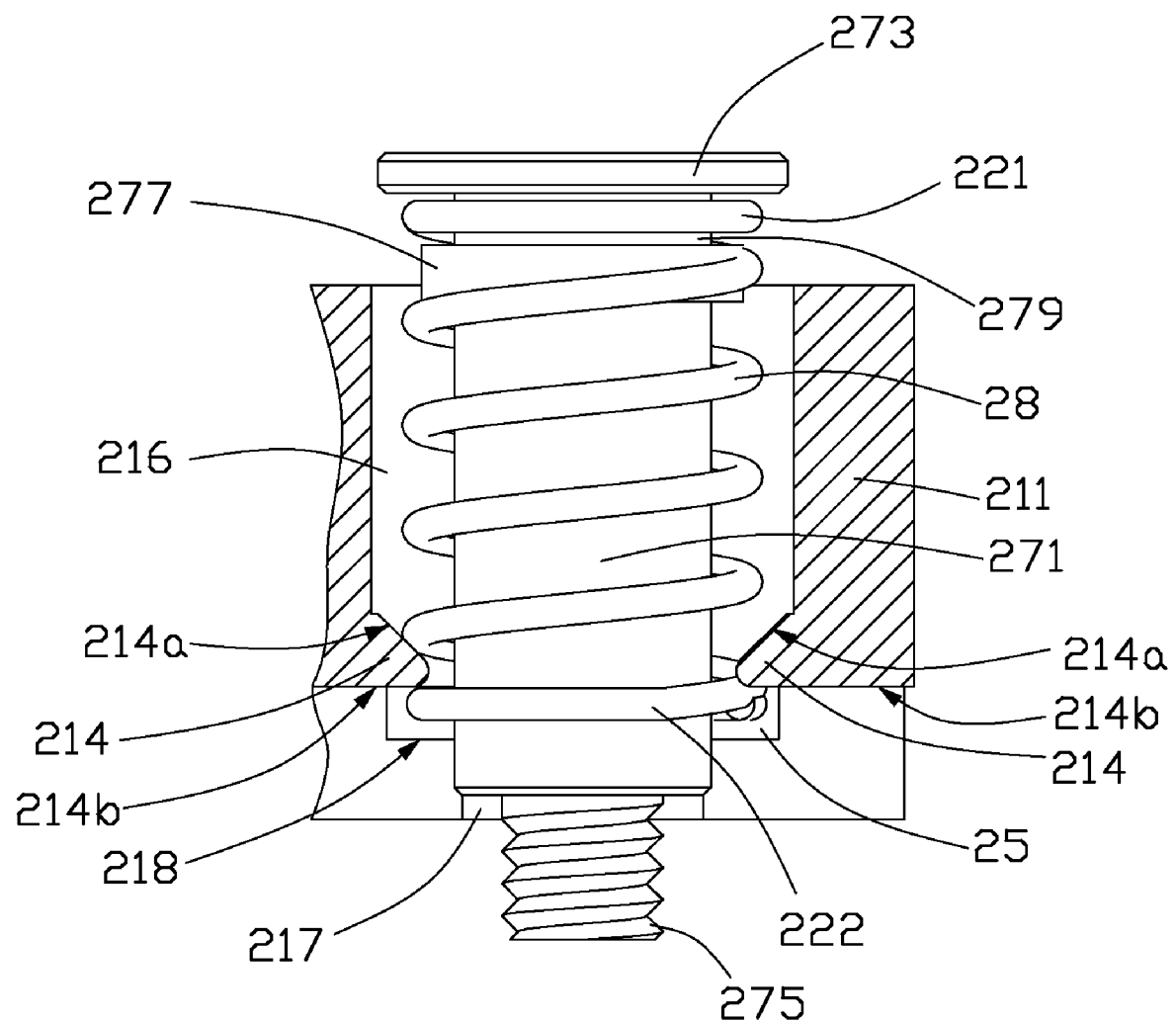
FIG. 3 is an assembled, cross-sectional view of the latch hook engaging with a fastener of the heat dissipating device of FIG. 1.

Referring to FIGS. 2-3, each through hole 213 of the heat sink 21 includes an upper portion 216 and a lower portion 217. The upper and lower portions 216, 217 are coaxial. The upper portion 216 has a diameter larger than that of the lower portion 217. A step 218 is thus formed between the upper portion 216 and the lower portion 217. A pair of latch hooks 214 are formed in each of the through holes 213. The two latch hooks 214 are symmetrical to the axis of the through hole 213. The two latch hooks 214 extend inwardly near a bottom of the upper portion 216 of the through hole 213. A bottom surface 214b of each latch hook 214 is planar-shaped. The bottom surface 214b of the latch hook 214 is higher than the step 218, and thus a receiving space 25 is defined between the bottom surface 214b of the latch hook 214 and the step 218. A top surface 214a of each latch hook 214 is aslant, and a height of the latch hook 214 gradually decreases inwardly along a radial direction of the through hole 213. An arc-shaped chamfer angle (not labeled) is formed at an inner end of each latch hook 214.

Referring to FIG. 1 again, the heat dissipating device 2 includes four fasteners 22. Each fastener 22 includes a bolt 27 and a coil spring 28 mounted therearound. The bolt 27 has a glazed column-shaped main portion 271, a head portion 273 positioned at a top end of the main portion 271, and a threaded fixing portion 275 formed at a bottom end of the main portion 271. The head portion 273 has a diameter larger than that of the main portion 271. The main portion 271 includes a ring-like flange 277 extending outwardly from an outer surface thereof adjacent to the head portion 273. An annular groove 279 is thus defined between the flange 277 and the head portion 273 for engaging a top ring 221 of the coil spring 28, thereby preventing the coil spring 28 from falling off the bolt 27. The diameter of the main portion 271 is greater than a diameter of the fixing portion 275.

Referring to FIG. 3, in assembly of the heat dissipating device 2, the coil spring 28 is mounted to surround the main portion 271 of the bolt 27 with the top ring 221 thereof engaging into the groove 279, respectively. The bolt 27 of the fastener 22 is placed in the corresponding through hole 213 of the heat sink 21. The head portion 273 of the bolt 27 is then pressed downwardly until the bottom ring 222 of the coil spring 28 reaches to the latch hook 214. When the bottom ring 222 of the bolt 27 reaches to the corresponding latch hook 214, the top surface 214a of the latch hook 214 guide the bottom ring 222 moving downwardly to run over the latch hooks 214 and finally the bottom ring 222 of the coil spring 28 snaps into the receiving space 25 defined between the latch hooks 214 and the step 218. During moving over the latch hooks 214, the bottom ring 222 of the coil spring 28 is gradually resiliently contracted by the tapered top surfaces 214a of the latch hooks 214 until the bottom ring 222 reaches and snaps into the receiving space 25, in which the bottom ring 222 returns to its original dimension and configuration. Thus, the fasteners 22 are pre-assembled to the heat sink 21. When assembling the heat sink 21 to the electronic component 24, the fixing portions 275 are brought to completely threadedly engage in the screw holes 230 of the circuit board 23 by continuously rotating the head portions 273 of the bolts 27. Thus, the electronic component 24 is sandwiched between the circuit board 23 and the heat sink 21 and intimately contacts with the base 211 of the heat sink 21.

In the embodiment, since the latch hooks 214 are integrally formed on the heat sink 21, the bottom rings 222 of the coil springs 28 of the fasteners 22 are snapped in the corresponding receiving spaces 25 defined by the latch hooks 214 and the heat sink 21, thus the fasteners 22 can have a simple structure and accordingly a low cost. The clipping member of the conventional art are avoided, and thus assembly of the clipping member to the bolts is no longer needed, without the disadvantage of the conventional art that the clipping member may engage in the fixing portion and drop from the bolt 27. Finally, the assembly of the fasteners 22 to the heat sink 21 of the heat dissipating device 2 can be more quickly completed than the conventional art.

Figure 4:
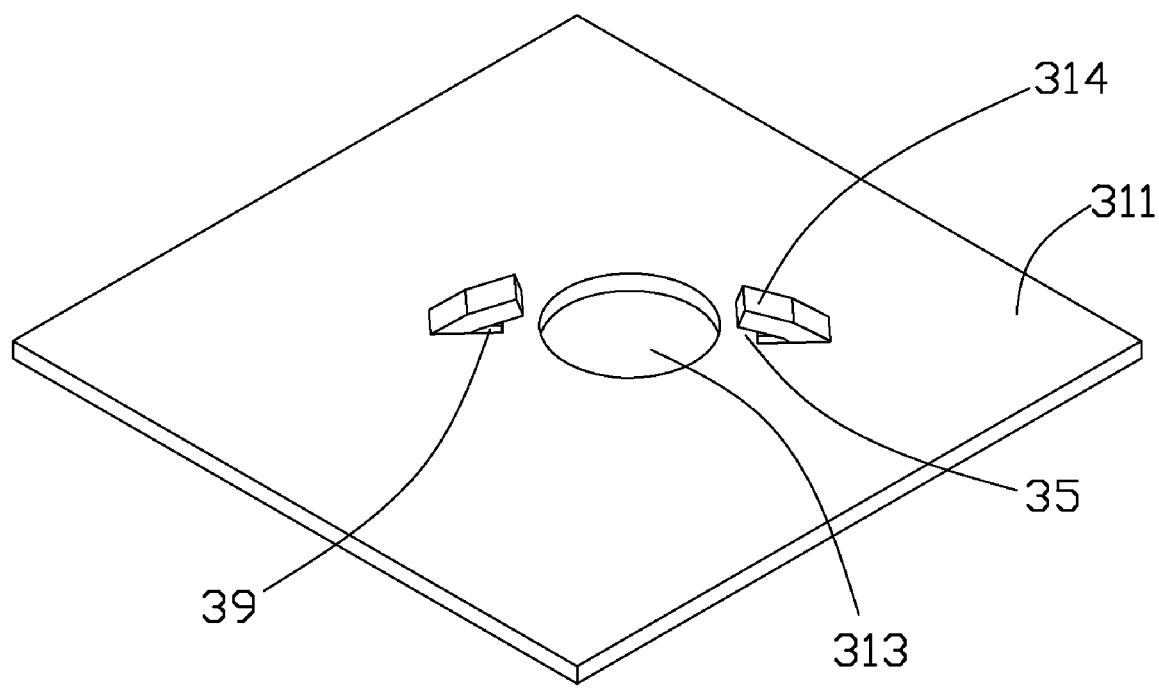
FIG. 4 is an isometric view of the latch hook of the heat dissipating device according to a second embodiment of the present invention.
Figure 5:
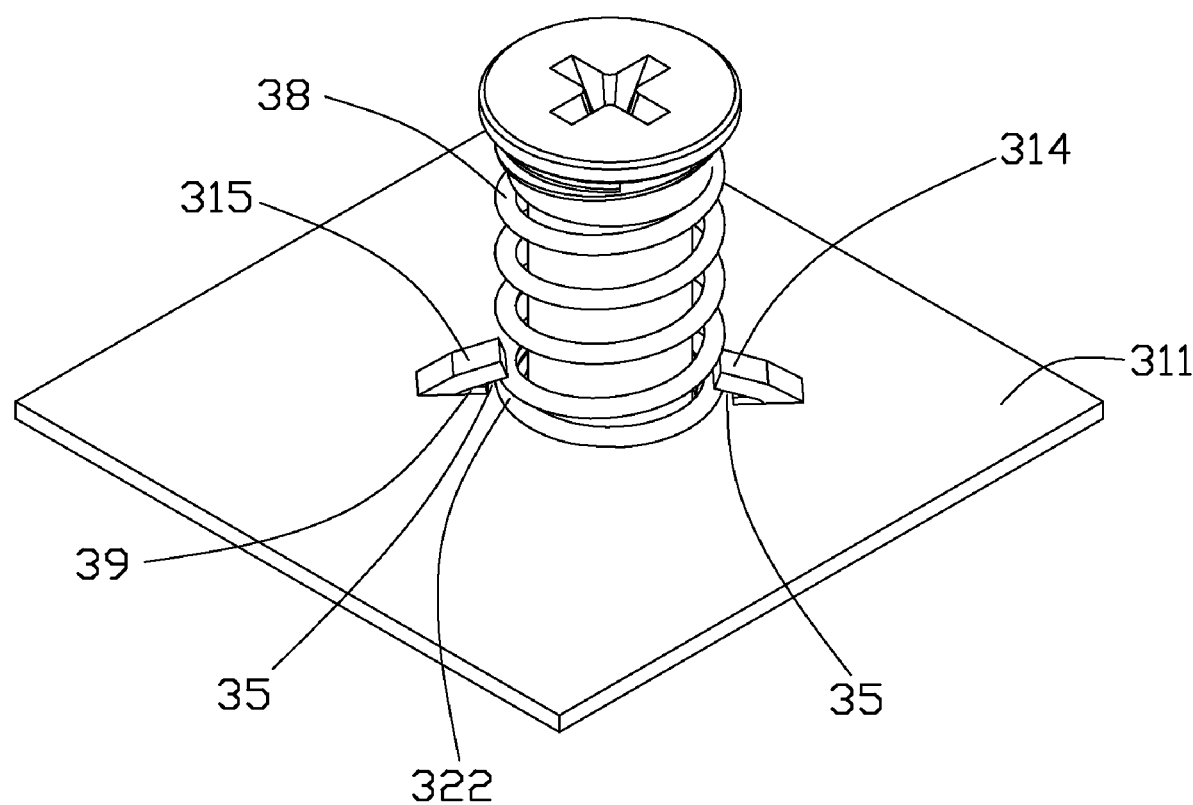
FIG. 5 shows the latch hook of FIG. 4 engaging with the heat sink of the heat dissipating device.

Referring to FIGS. 4-5, another embodiment of the present invention is shown. The difference of this embodiment over the previous embodiment is as follows. The latch hooks 314 are formed on the base 311 around the through holes 313. As shown in FIG. 4, the latch hooks 314 extend upwardly and inwardly from a top surface of the base 311. The two latch hooks 314 are aslant. A receiving space 35 is thus defined between each latch hook 314 and the top surface of the base 311 receiving the bottom ring 322 of the coil spring 38. In this embodiment, the latch hooks 314 are integrally formed with the base 311, and a pair of apertures 39 are defined in the base 311 corresponding to the latch hooks 314. It is to be understood that the latch hooks 314 are adapted for engaging with the coil springs 38, the shape of the latch hooks 314 is not limited to be aslant, other shapes, such as arc, slant and inverse "L" are also suitable.

Figure 6:
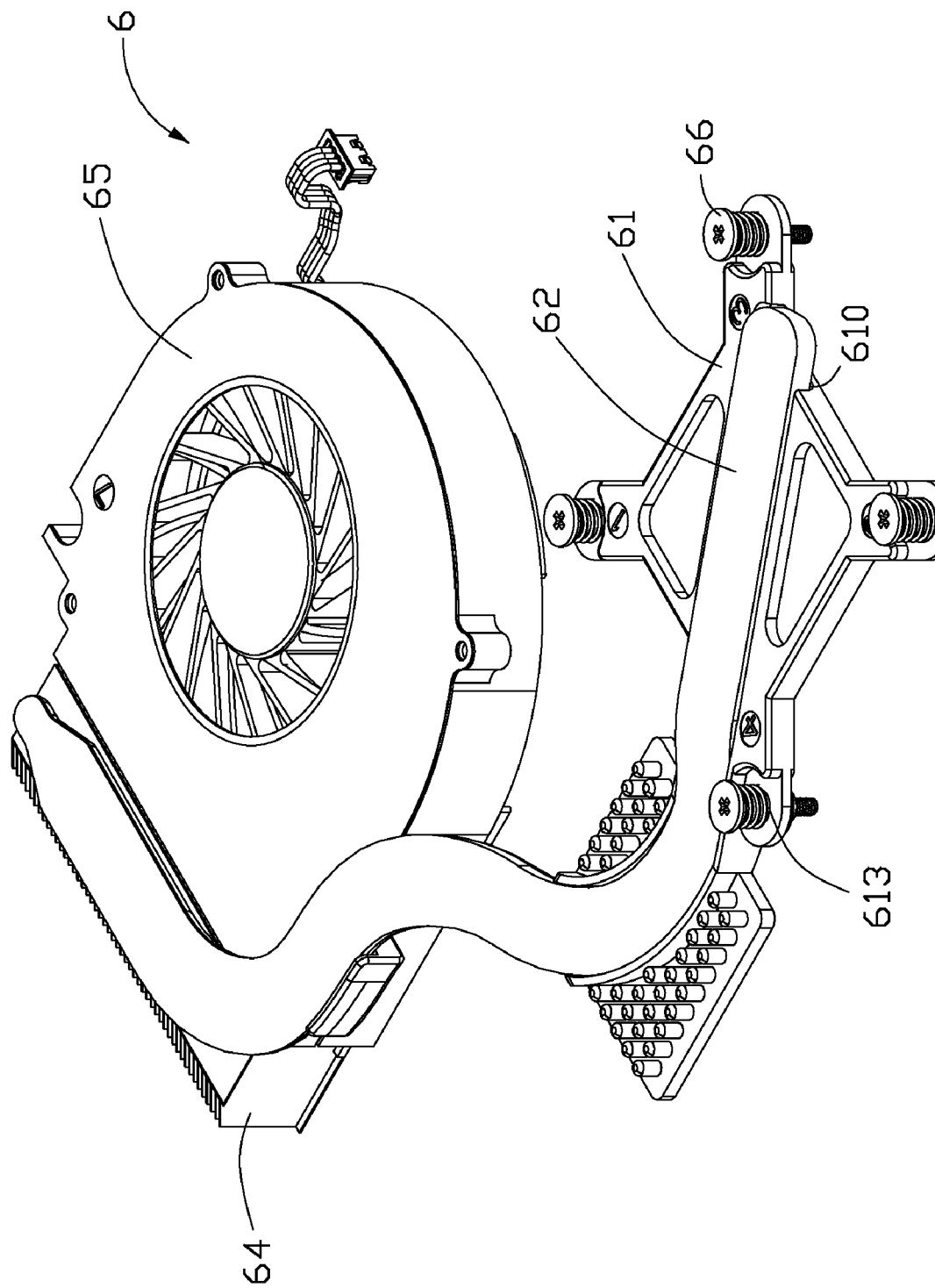
FIG. 6 shows a third embodiment of the heat dissipating device according to the present invention.
Figure 7:
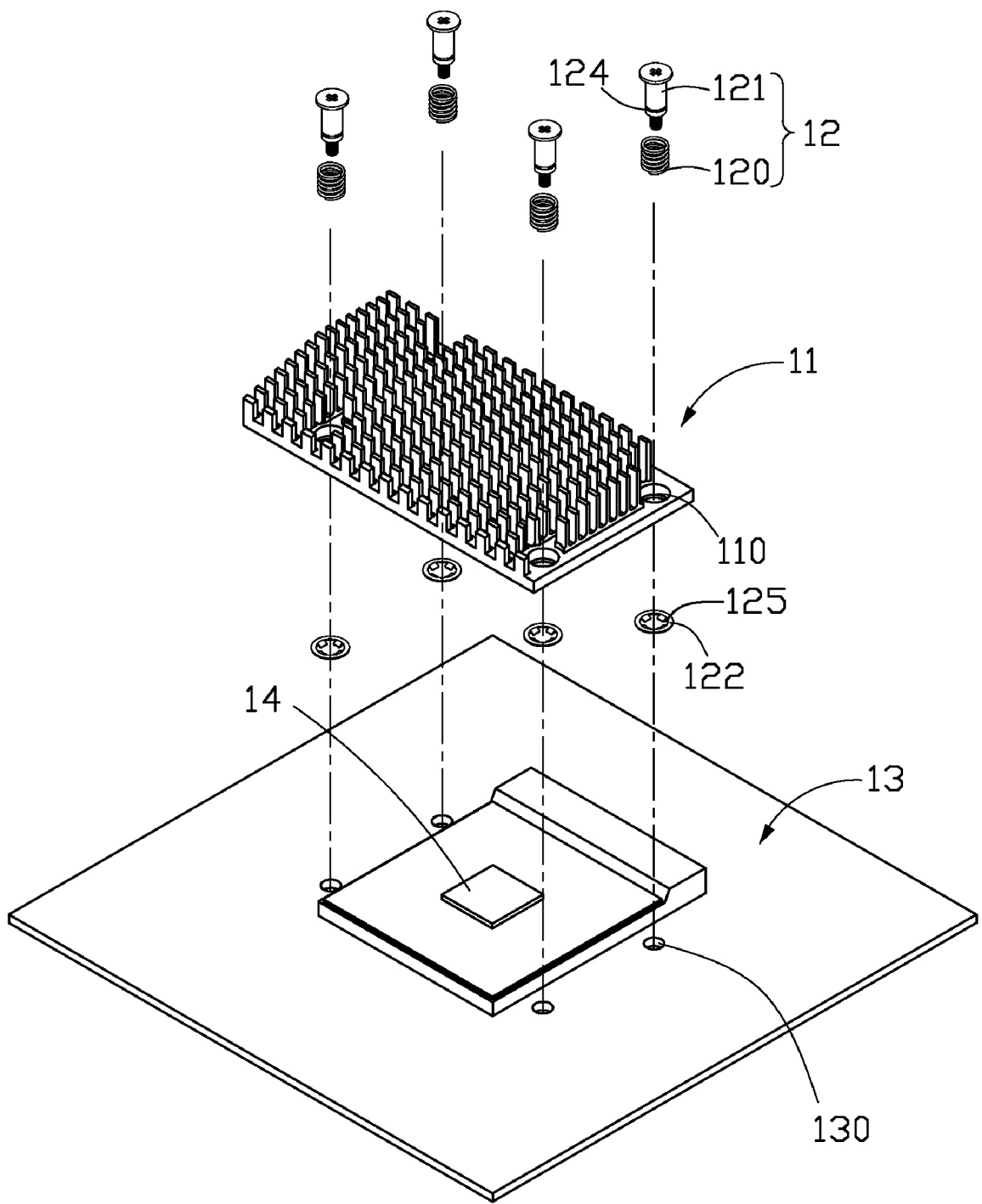
FIG. 7 is an exploded view of a heat dissipating device according to related art.

FIG. 6 shows a third embodiment of the present invention. The heat dissipating device 6 includes a base 61 defining four through holes 613, a heat pipe 62, a fin unit 64, and a fan 65. As the first embodiment, the latch hooks are formed in the through holes 613 of the base 61. The shape of the latch hooks of this embodiment is the same as that of the first embodiment. The base 61 defines a mounting groove 610 in a top surface thereof. The heat pipe 62 has an evaporating section received in the mounting groove 610 of the base 61 and thermally attached to the base 61, and a condensing section extending outwardly. The fin unit 64 is arranged at an air outlet of the fan 65. The condensing section of the heat pipe 62 is thermally attached to the fin unit 64. Thus the heat generated by the electronic component 24 can be transferred to the fin unit 64 by the heat pipe 62 almost immediately. When a forced airflow generated by the fan 65 flows through the fin unit 64, the heat can be efficiently carried away by the airflow. Therefore, the heat of the electronic component 24 can be dissipated immediately.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipating device being adapted for dissipating heat of an electronic component comprising:
    a base defines a through hole therein, a latch hook being formed on the base near the through hole; and
    a fastener comprising a bolt and a coil spring mounted around the bolt, the through hole being adapted for extension of the bolt when the heat dissipating device is assembled to the electronic component, at least one ring of the coil spring being sandwiched between the latch hook and the base;
    wherein the through hole comprises a large portion having a relatively larger diameter and a small portion having a relatively smaller diameter, a step being formed between the large portion and the small portion, the latch hook extending inwardly from a bottom of the large portion, the at least one ring of the coil spring being arranged between the latch hook and the step.

2. The heat dissipating device as claimed in claim 1, wherein the latch hook forms an aslant guiding surface facing to the coil spring to guide movement of the coil spring.

3. The heat dissipating device as claimed in claim 1 further comprising a plurality of fins arranged on the base.

4. The heat dissipating device as claimed in claim 1 further comprising a heat pipe having an evaporating section thermally attaching to the base, a fin unit thermally attaching to a condensing section of the heat pipe, and a fan generating a forced airflow to the fin unit.

5. The heat dissipating device as claimed in claim 1, wherein an annular flange extends outwardly from the bolt near a top end thereof, an annular groove being defined between the top end of the bolt and the flange, a top ring of the coil spring being received in the groove.

6. A heat dissipating device, comprising:
    a circuit board defining a plurality of screw holes therein;
    an electronic component being arranged on the circuit board;
    a base being thermally attached to the electronic component, the base defining a plurality of through holes corresponding to the screw holes of the circuit board; and
    a plurality of fasteners, each fastener comprising a bolt extending through a corresponding through hole of the base and then threadly engaging into a corresponding screw hole of the circuit board, and a coil spring mounted around the bolt;

wherein the base forms a plurality of latch hooks near each through hole, and a bottom ring of each coil spring is sandwiched between the latch hooks and the base; and wherein each through hole comprises a large portion having a relatively larger diameter and a small portion having a relatively smaller diameter, a step being formed between the large portion and the small portion, the latch hooks extending inwardly from a bottom of the large portion, the bottom ring of each coil spring being arranged between the latch hooks and the step.

7. The heat dissipating device as claimed in claim 6, wherein each latch hook forms an aslant guiding surface facing to a corresponding coil spring to guide the corresponding coil spring moving downwardly.

8. The heat dissipating device as claimed in claim 6 further comprising a plurality of fins arranged on the base.

9. The heat dissipating device as claimed in claim 6 further comprising a heat pipe having an evaporating section thermally attaching to the base, a fin unit thermally attaching to a condensing section of the heat pipe, and a fan generating a forced airflow to the fin unit.

10. The heat dissipating device as claimed in claim 6, wherein the bolt has a column-shaped main portion, a head portion positioned at a top end of the main portion and having a diameter larger than that of the main portion, and a threaded fixing portion formed at a bottom end of the main portion, the main portion comprising a ring-like flange extending outwardly from an outer surface thereof at a position adjacent to the head portion, an annular groove being defined between the flange and the head portion for receiving a top ring of the coil spring therein.

11. A heat dissipating device being adapted for dissipating heat of an electronic component comprising:

a base defines a through hole therein, a latch hook being formed on the base near the through hole; and a fastener comprising a bolt and a coil spring mounted around the bolt, the through hole being adapted for extension of the bolt when the heat dissipating device is assembled to the electronic component, at least one ring of the coil spring being sandwiched between the latch hook and the base;

wherein the latch hook extends upwardly from a top surface of the base and towards the through hole, a receiving space is defined between the latch hook and the top surface of the base, the at least one ring of the coil spring is received in the receiving space.

12. The heat dissipating device as claimed in claim 11, wherein an aperture is defined in the base corresponding to the latch hook.

* * * * *